United States Patent [19]

Rogacki et al.

[11] Patent Number: 4,906,926
[45] Date of Patent: Mar. 6, 1990

[54] PROXIMITY SENSOR FOR HOSTILE ENVIRONMENTS

[75] Inventors: Steven A. Rogacki, Ann Arbor; Robert M. Carabbio, Saline; Alfred F. Herbermann, Ann Arbor, all of Mich.

[73] Assignee: Syron Engineering & Manufacturing Corporation, Saline, Mich.

[21] Appl. No.: 194,339

[22] Filed: May 16, 1988

[51] Int. Cl.⁴ .............................................. G01V 3/08
[52] U.S. Cl. ..................................... 324/236; 294/907; 324/207.19; 361/179; 901/46
[58] Field of Search ............... 324/236, 207, 208, 234, 324/237, 238, 158 F; 331/65; 307/309; 361/179, 180; 901/35, 46; 294/907

[56] References Cited

U.S. PATENT DOCUMENTS

| | | | |
|---|---|---|---|
| 2,329,811 | 9/1943 | Zuschlag | 324/242 |
| 3,743,853 | 7/1973 | Dittman et al. | 307/116 |
| 3,747,012 | 7/1973 | Buck | 331/65 |
| 3,852,662 | 12/1974 | Katz | 324/234 |
| 3,919,629 | 11/1975 | Scruggs | 260/404.5 |
| 4,001,718 | 1/1977 | Wilson et al. | 331/65 |
| 4,587,486 | 5/1986 | Soyck | 324/207 X |
| 4,678,992 | 7/1987 | Hametta | 324/208 |
| 4,678,994 | 7/1987 | Davies | 324/207 X |
| 4,697,246 | 9/1987 | Zemke et al. | 901/46 X |
| 4,724,384 | 2/1988 | Castovilly et al. | 324/207 |

Primary Examiner—Reinhard J. Eisenzopf
Assistant Examiner—Robert W. Mueller
Attorney, Agent, or Firm—Dykema Gossett

[57] ABSTRACT

Proximity sensors for detecting the presence of metal objects such as sheet metal workpieces within workpiece engaging devices such as grippers and shovels. The proximity sensors are jacketed in a stainless steel casing, making them rugged and resistant to impact damage. Monitor circuits are used with the sensor which enable the devices to sense objects through their metal casing.

7 Claims, 3 Drawing Sheets

PROXIMITY SENSOR FOR HOSTILE ENVIRONMENTS

BACKGROUND AND SUMMARY OF THE INVENTION

This invention relates to proximity sensors and related circuits, and particularly to such systems adapted for sensing metal workpieces in hostile conditions.

Proximity sensors are used in various facets of manufacturing for detecting the approach of metal objects. An example of a suitable application for such devices is for automated sheet metal forming lines such as progressive die press operations where proximity sensors could be used for determining whether or not material handling systems are properly engaging workpieces as they are moved from one work station to another. If a part engaging member such as a shovel or articulated gripper does not properly receive a workpiece and such absence is detected, the material handling and fabrication machinery could be interrupted to correct the failure. Workpieces which are not in their proper position can lead to the generation of scrap and can also damage equipment of the fabrication system.

Inductive type proximity sensors have been in use for many years and operate on the principle that approaching magnetic objects change the inductive characteristics of the sensors, which, in a simplified form, is no more than a coil of wire wrapped around a ferrite core. This change in inductance characteristic produces a reduced output from a resonant tank circuit which the sensor is a part of. The tank circuit voltages are detected and output through appropriate signal processing electronics. Present proximity sensor systems operate at relatively high frequencies (e.g. 200 to 300 KHz), and are used with high "Q" tank circuits (i.e. circuits with high impedance to resistance ratios). Such sensor systems cannot sense through a layer of metal to detect objects on the opposite side of the layer, due to eddy current losses occurring in the metal layer. Accordingly, such proximity sensors have a sensing face which is nonmetallic. Typically, the coils are potted using epoxy compounds or other plastic materials which cover the sensing face. In many applications for proximity sensors such as the application discussed above, proximity sensors are exposed to extreme environmental conditions where they can be struck by metal workpieces and subjected to abrasives, cutting fluids, etc. For such applications, the vulnerable configuration of prior art proximity sensors renders them unsuited for use. Accordingly, there is a need to provide a proximity sensor which can be encased in a durable material such as a metal, while providing sensitivity for detecting other metal objects.

In addition to the foregoing, since present inductive proximity sensors are used with high "Q" tank circuits, and since a full metallic enclosure results inherently in a circuit with a low "Q" value, there is a need for an amplifier system which can function with a low "Q" circuit and detect small changes in that "Q" value.

In accordance with this invention, several embodiments of proximity sensor systems achieving the above mentioned desirable characteristics are provided. Proximity sensors according to this invention can be encased in metal such as stainless steel while enabling the detection of approaching metal objects. The resulting sensor is extremely durable and can therefore be used in hostile operating conditions. These capabilities are achieved, in part, by driving the proximity sensor coil at a relatively low frequency, for example, at less than 10 KHz. The stainless steel encasing material is relatively invisible to the low excitation frequency, since eddy current losses decrease with frequency. The reason that a portion of the sensing field extends through a given thickness of stainless steel is that the product of circuit "Q" and skin depth have been maximized. Skin depth is greater for a high resistivity material like stainless steel and it also is larger for lower frequencies. Therefore, the relative "invisibility" of the stainless is due to the low frequency used and to the high electrical resistivity of the stainless. These features make it necessary to employ relatively low "Q" tank circuits (since "Q" decreases with frequency). Various circuit designs are disclosed as means for evaluating small changes in output of the sensing inductor which provide excellent sensitivity, while enabling use of low "Q" low frequency sensing circuits.

Additional benefits and advantages of the present invention will become apparent to those skilled in the art to which this invention relates from the subsequent description of the preferred embodiments and the appended claims, taken in conjunction with the accompanying drawings.

DETAILED DESCRIPTION OF THE INVENTION

Figure 1:
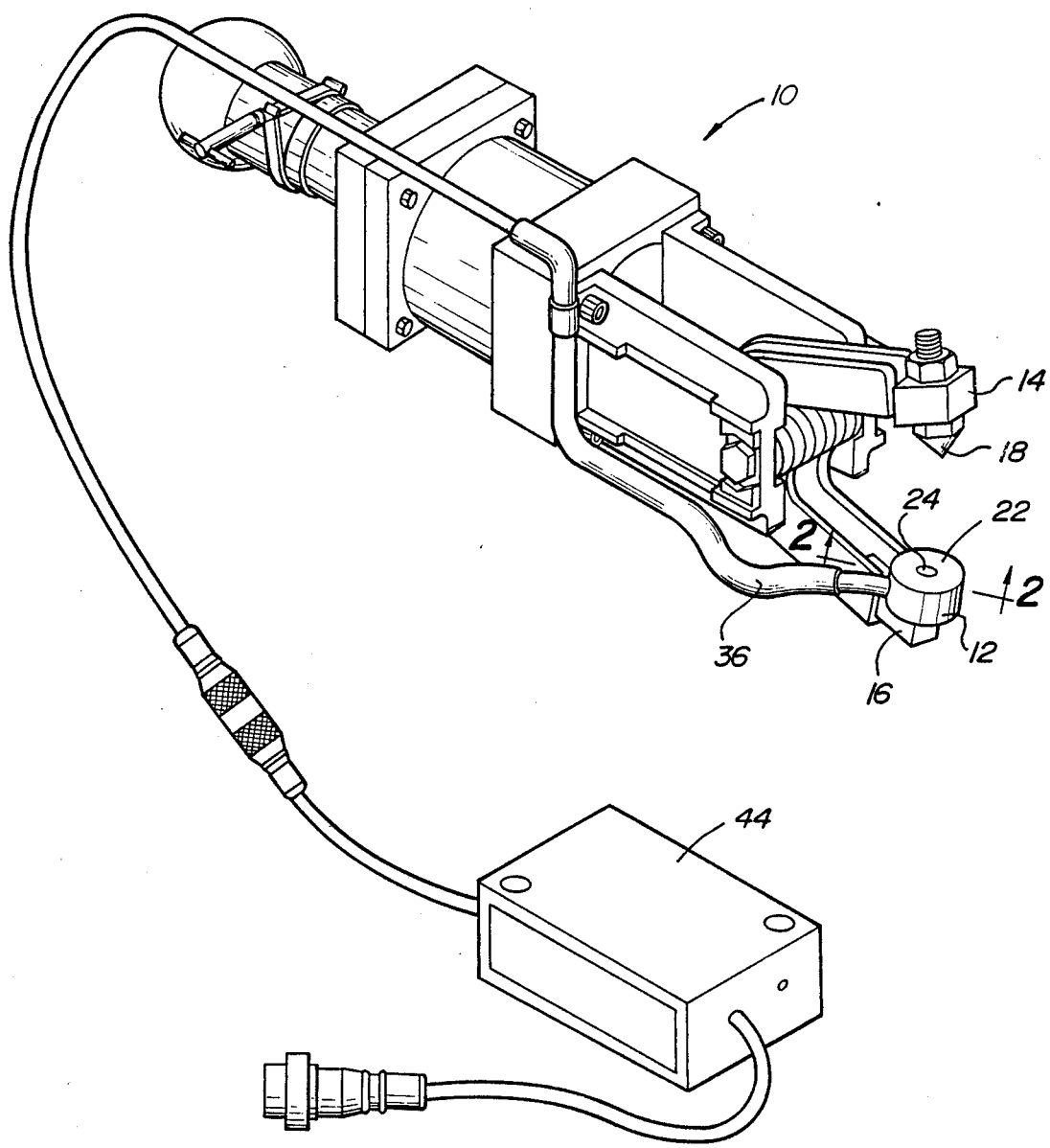
FIG. 1 is a pictorial view of a workpiece gripper incorporating a proximity sensor in accordance with a first embodiment of this invention.

FIG. 1 illustrates a gripper assembly, generally designated by reference number 10, incorporating a proximity sensor 12 in accordance with one embodiment of the present invention. Gripper assembly 10 is robotically controlled to properly position gripper jaws 14 and 16 to engage a workpiece. As previously mentioned, there is a need to determine with certainty whether or not workpiece handling systems have, in fact, properly received a workpiece such as a sheet metal blank. Gripper assembly 10 incorporates proximity sensor 12 as the engaging face of jaw 16. Thus, when a sheet metal workpiece is received between jaws 14 and 16, and the jaws are clamped against the workpiece, the workpiece is in direct contact with proximity sensor 12. Due to the rugged construction of proximity sensor 12, it is capable of restraining significant gripping forces. Jaw 14 forms a gripper point 18 which slightly penetrates the workpiece surface to ensure positive engagement. Monitor 44 provides the electrical circuitry which outputs a digital signal (although analog outputs are possible)

which triggers associated equipment such as warning devices or automatic shut-down systems.

Figure 2:
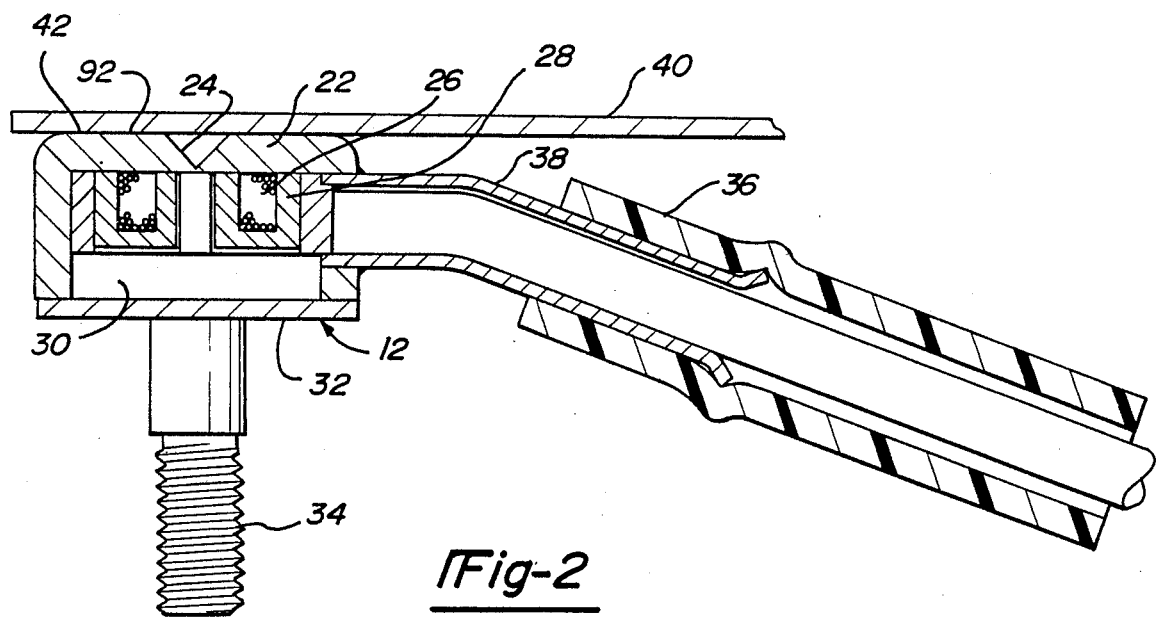
FIG. 2 is a cross-sectional view through the gripper sensor taken along line 2—2 of FIG. 1.

With particular reference to FIG. 2, details of the construction of proximity sensor 12 are shown. Proximity sensor 12 includes a cup-shaped housing 22 made from a stainless steel material. A central depression 24 receives gripper point 18 when the jaws 14 and 16 are closed without a workpiece present. An inductor coil 26 is wrapped within ferrite core 28 and potting material is employed to fill the voids around the core. Coil 26 generates a sensing field which penetrates housing 22 and is present at face 42. Additional encasing metal layers are formed by end plates 30 and 32. Threaded mounting post 34 enables sensor 12 to be secured to jaw 16. Cable assembly 36 is connected to opposite ends of coil 26 and is held in position by metal tubular stiffener 38. FIG. 2 illustrates a sheet meatl workpiece 40 in close contact with sensing face 42.

Figure 3:
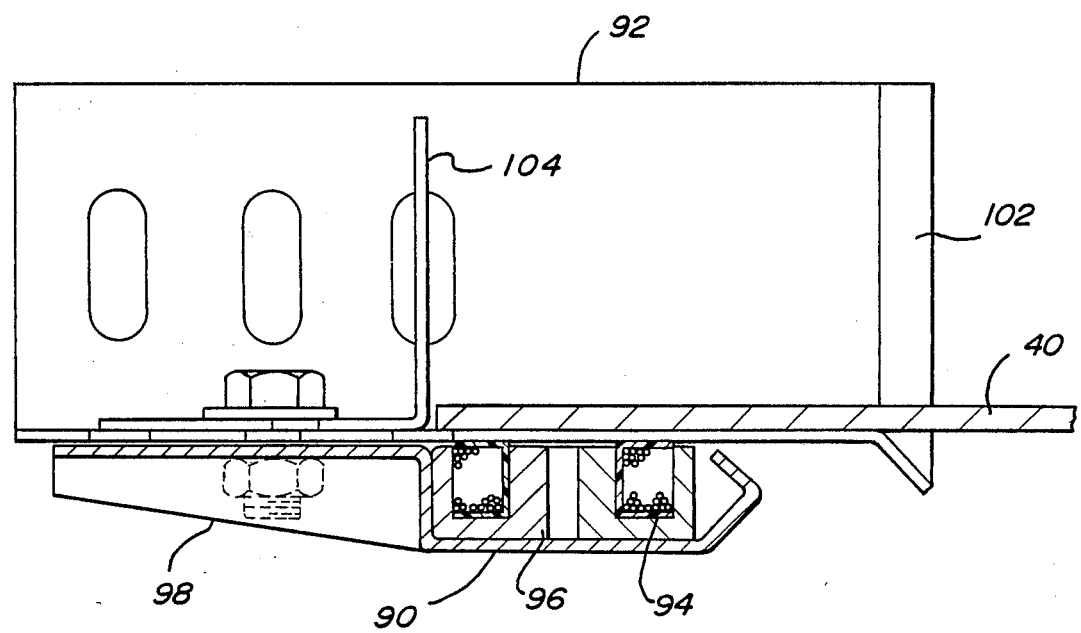
FIG. 3 is a partially elevational and partially cross-sectional view of a proximity sensor in accordance with a second embodiment of this invention used in conjunction with a shovel type metal workpiece transporting device.

A proximity sensor in accordance with the second embodiment of this invention is shown in FIG. 3 and is generally designated by reference number 90. Sensor 90 is particularly adapted to be mounted to a metal workpiece engaging "shovel" 92 which is adapted to engage and lift a corner of a sheet metal blank. Shovel 92 defines a flared opened end 102 and a barrier 104 which controls the position of the workpieces. Shovel 92 is made from stainless steel with sensor 90 mounted to the bottom of the shovel, such that it senses the workpiece through the bottom surface of the shovel. Sensor 90 includes coil 94 wrapped around ferrite core 96, and is mounted to shovel 92 via bracket 98.

Figure 4:
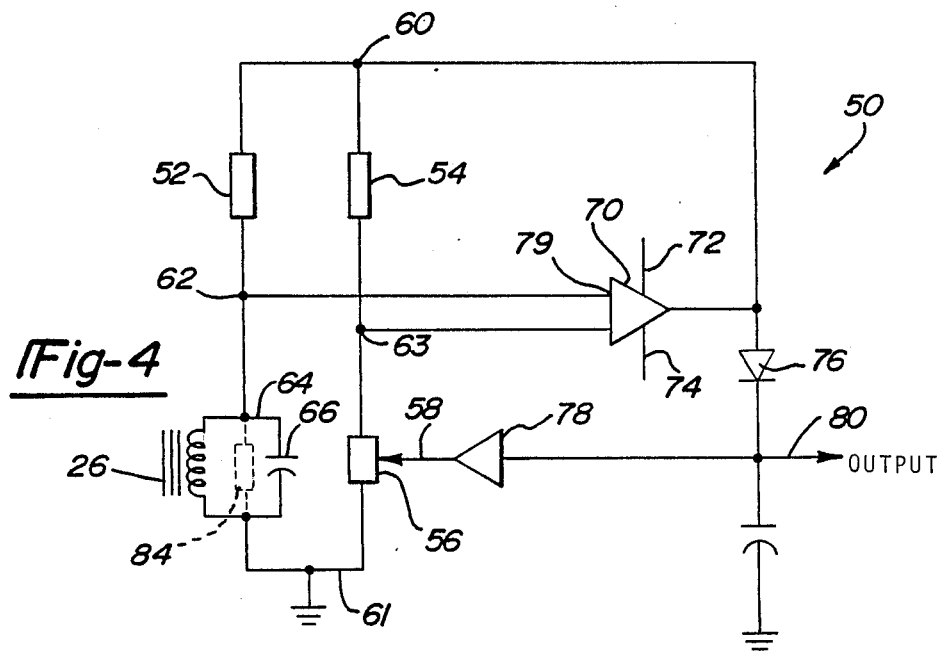
FIG. 4 is an electrical schematic diagram showing a simplified electrical circuit for a monitor in accordance with a first embodiment of this invention.

An example of circuitry which enables proximity sensor 12 to detect the existence of workpiece 40 is shown in FIG. 4. This figure is a simplified schematic for monitor circuit 50. Circuit 50 is particularly useful for use with low inductance sensor coil, such as that shown in FIG. 4, which in accordance with an experimental embodiment of applicant, had an inductance of about 4 mH. Circuit 50 includes a bridge circuit having a pair of arms formed by fixed value resistors 52 and 54. The lower half of the bridge is formed by voltage controlled resistor 56 which provides a variable resistance as a function of input voltage on line 58. The remaining leg of the bridge is formed by L-C parallel resonant tank circuit 64 which includes proximity sensor coil 26 and capacitor 66. Bridge nodes 60 and 61 are power inputs and nodes 62 and 63 are outputs. The outputs from bridge nodes 62 and 63 are fed into OP/AMP 70 which amplifies their difference and receives a power supply voltage at inputs 72 and 74. The output of OP/AMP 70 is directed back through bridge node 60 and is also directed through diode 76 to OP/AMP 78, having an output which drives voltage controlled resistor input 58. Line 80 provides an output signal for signal processing and threshold detecting circuits, according to well known designs.

In operation of monitor circuit 50, L-C tank circuit 64 operates at resonance and can be representative by an equivalent resistor 84. Monitor circuit 50 would preferably be designed to operate at a frequency in the range of up to 10 KHz. In one experimental embodiment, monitor circuit 50 oscillated at about 1000 Hz. During normal operation, the bridge is intentionally maintained slightly out of balance through appropriate selection of the elements of the arms of the bridge. When a metal object approaches proximity sensor coil 26, the "Q" of the circuit decreases due to a change in inductance of coil 26, which reduces the effective resistance of equivalent resistor 84. This imbalance causes the voltage along OP/AMP positive input 79 to increase, which signal is fed back to voltage controlled resistor 56, causing its equivalent resistance value also to drop, tending to maintain the circuit in balance. The combined effect on the equivalent resistance of resistor 84 and voltage controlled resistor 56 causes the alternating signal through the circuit detected at output line 80 to be decreased upon the approach of a ferrous metal object to proximity coil 26. The circuit therefore operates as a "Q" multiplier by exaggerating small changes in the L-C tank circuit 64 provided by the balancing influence of voltage controlled resistor 56.

Figure 5:
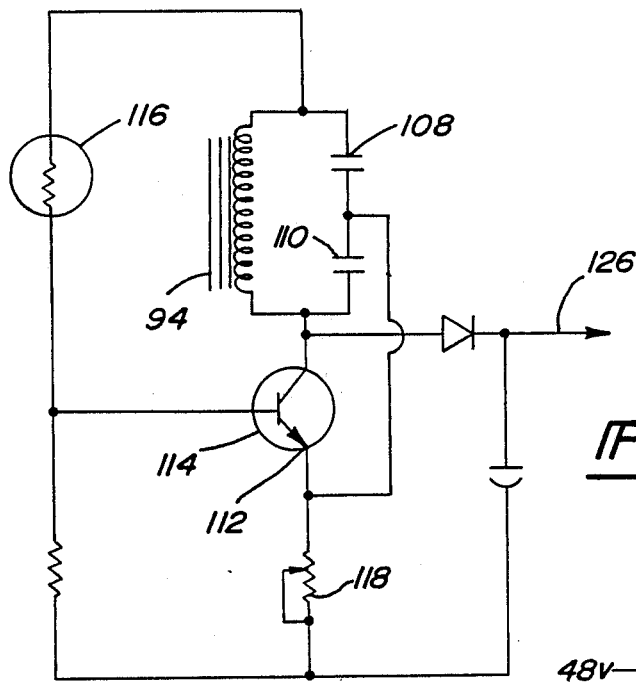
FIG. 5 is a simplified electrical circuit of a monitor according to a second embodiment of the invention.
Figure 6:
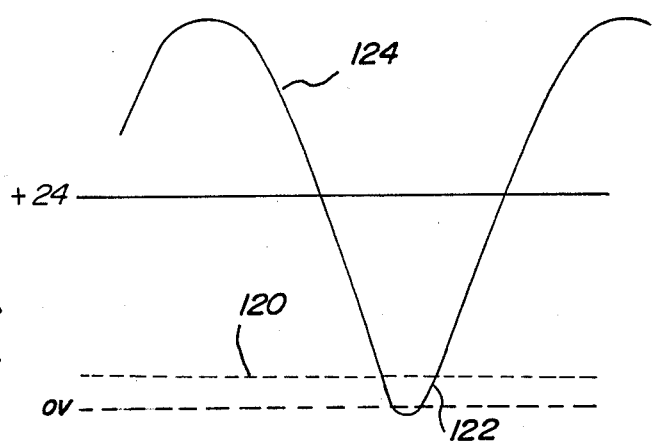
FIG. 6 is a waveform diagram related to the circuit shown in FIG. 5.

FIG. 5 illustrates another embodiment of a monitor circuit 106 which may be used proximity sensor 12 or 90. This design employes a modified Colepitts oscillator, comprising coil 94 in a tank circuit with capacitors 108 and 110 with an output between the capacitors fed into emitter 112 of transistor 114. Temperature compensating thermistor 116 and variable resisotr 118 are used to adjust the biasing and operating point of transistor 114. FIG. 6 illustrates oscillations taking place through monitor circuit 106. The curves can be divided into two sections, the first section 124, above dotted line 120, represents the free oscillations or "ringing" within the tank circuit which is driven by the portion of the curve represented by 122 which is the region that transistor 114 is conducting. Accordingly, the system operates like a conventional Colepitts oscillator but with the transistor operating only in the lower portion of the curve as a driver, and thus the system is a non-linear driven oscillator. Monitor circuit 106 operates best at frequencies of around 1000 Hz.

In operation, monitor circuit 106 is allowed to oscillate as shown in FIG. 6, but upon the approach of a ferrous material, the inductive coupling and eddy current loses within that material absorb energy, thus significantly reducing the amplitude of curve 124. Such reductions are detected through appropriate threshold detector circuits coupled to output 126 which is used to drive a load such as a switching device or visual indicator.

While the above description constitutes the preferred embodiments of the present invention, it will be appreciated that the invention is susceptible to modification, variation and change without departing from the proper scope and fair meaning of the accompanying claims.

We claim:

1. An articulated gripper with a proximity sensor for detecting the presence of a metal workpiece comprising:
    a pair of movable opposed jaws having facing clamping surfaces;
    a sensor comprising a metal casing means for forming a hollow inside cavity and defining a metal outer sensing face, a coil disposed entirely within said casing inside cavity, for defining a sensor field through said sensor face, a sensor circuit for measuring changes in inductance of said coil caused by the presence of said workpiece when in close proximity with said sensing face; and
    said sensor mounted within a clamping surface of a first jaw, said coil of said sensor having a center axis, said center axis being generally normal to said clamping surface of said first jaw.

2. A proximity sensor according to claim 1 wherein said sensor circuit excites said coil at a frequency above 500 Hz.

3. A proximity sensor according to claim 1 wherein said sensor circuit excites said coil at a frequency less than 10 KHz.

4. A proximity sensor according to claim 1 wherein said sensor coil is mounted to a workpiece shovel.

5. A proximity sensor according to claim 1 wherein said sensor circuit includes a resistance bridge having four legs in which said coil and a capacitor comprise one of said legs and two nodes of said bridge form inputs to an amplifier and the amplifier output is connected to another node of said bridge and controls a voltage controlled resistor which forms another leg of said bridge.

6. A proximity sensor according to claim 1 wherein said sensor circuit includes a Colepitts oscillator and wherein said workpiece suppresses oscillation within said oscillator when in close proximity with said sensing face.

7. A proximity sensor according to claim 1 wherein said metal casing is made of stainless steel.

* * * * *